Oct. 24, 1961 B. M. GORDON 3,005,964
SIGNAL FORM CONVERSION APPARATUS
Filed April 18, 1958
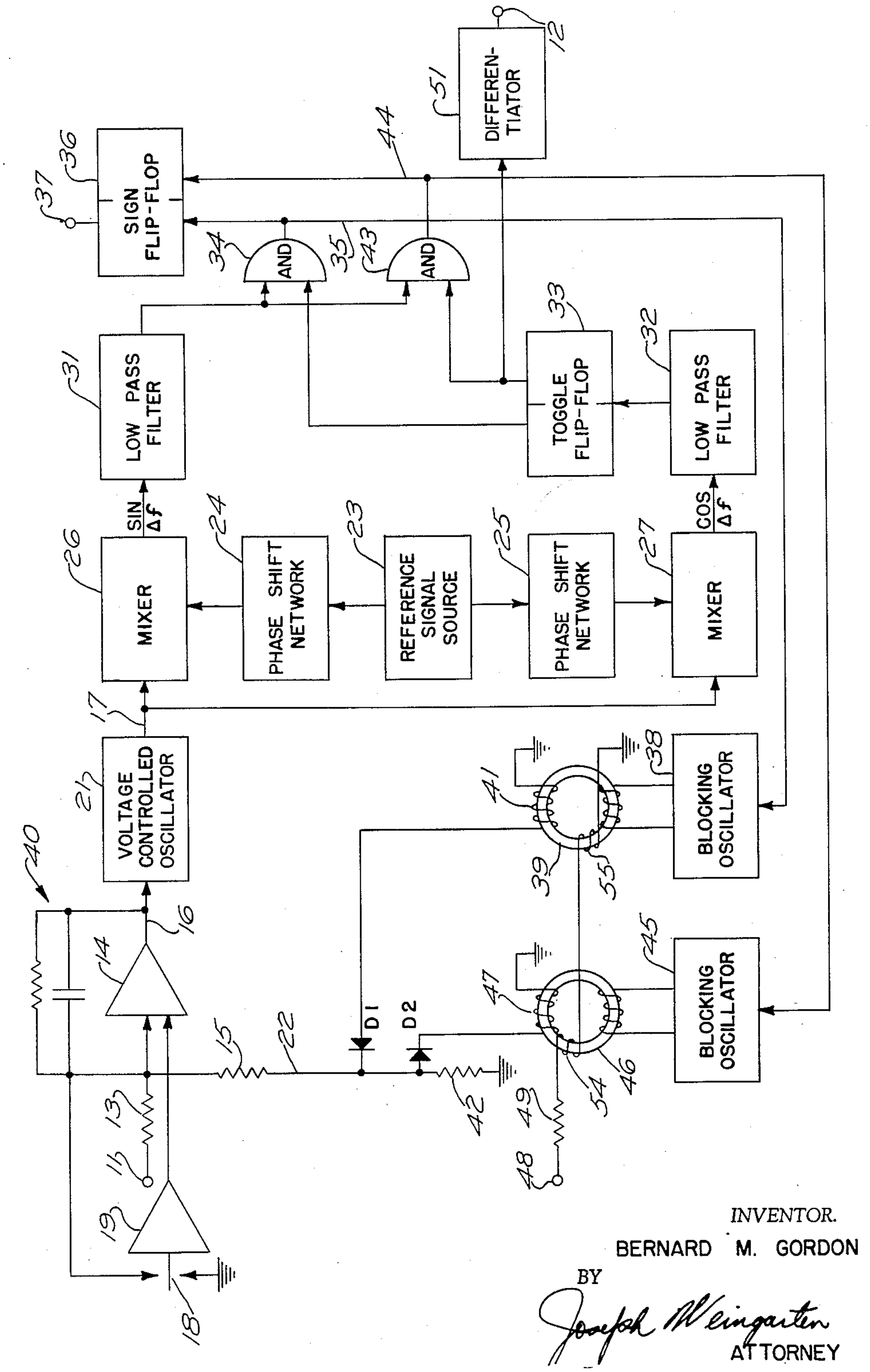
INVENTOR.
BERNARD M. GORDON
BY
Joseph Weingarten
ATTORNEY United States Patent Office 3,005,964
Patented Oct. 24, 1961

3,005,964

SIGNAL FORM CONVERSION APPARATUS

Bernard M. Gordon, Newton, Mass., assignor to Epsco, Incorporated, Boston, Mass., a corporation of Massachusetts Filed Apr. 18, 1958, Ser. No. 729,321
3 Claims. (Cl. 332—19)

The present invention relates in general to signal translation and more particularly concerns a novel system for establishing a precisely linear relationship between the amplitude of a first signal and the rate of a second signal while minimizing the number of precision components required to maintain the desired degree of linearity. In addition, the novel system presents an indication of the polarity of the first signal.

Numerous techniques are available for converting the amplitude of an input signal to an output signal rate. One of the most common techniques is to apply the input signal to the grid of a reactance tube arranged in the frequency-controlling circuit of an oscillator. This is satisfactory for many applications, such as frequency modulation broadcasting, where close tolerances on linearity are not required. However, the deviation from linearity of output signal rate as a function of input signal amplitude cannot be tolerated in applications, such as FM telemetry, where precise linearity is required over a wide dynamic range. A circuit capable of fulfilling these requirements is disclosed in the copending application of Bernard M. Gordon, entitled Voltage Controlled Oscillator, Serial No. 677,891, filed August 13, 1957. However, this circuit requires that a number of parameters remain within close tolerance limits in order to obtain the desired linearity. Although excellent operation is obtained, the output frequency is non-zero when the input signal amplitude is zero.

The present invention contemplates and has as a primary object the provision of apparatus which maintains an exceptionally high degree of linearity between the amplitude of a first signal and the rate of a second while minimizing the number of precision components required.

Another object of the invention is to provide a low-cost, highly reliable device for converting the amplitude of an input signal to an output signal having a frequency directly and linearly related to that amplitude.

Still another object of the invention is to accept a bipolar input signal and yield as an output, a binary indication of the input signal polarity.

A further object of the invention is to provide voltage-to-frequency conversion apparatus suitable for use in an analog-to-digital converter while minimizing the large number of precision components and voltage reference source usually associated with such devices.

According to the invention, an operational amplifier is arranged with a feedback loop including means for converting the output signal amplitude into a signal rate and means for converting this signal rate into a feedback signal which is applied to the amplifier input. An operational amplifier is a type of voltage-feedback amplifier in which the gain of the amplifier is real and negative and in which dual feedback is uesd. By "dual voltage feedback," it is meant that the output voltage of the amplifier is approximately converted into a current in the feedback process so that the feedback quantity is a current, fed back to the input of the amplifier, that is proportional to the output voltage. The term "dual current feedback" denotes that a voltage proportional to the output current of the amplifier, is fed back to the amplifier's input. The dual type of feedback, particularly the voltage type, is the form of feedback normally employed in operational amplifier. A general discussion of operational amplifiers is given on pages 22–26 of a book entitled "Pulse and Digital Circuits," by Millman and Taub, published by McGraw-Hill.

Other features, objects and advantages of the invention will become apparent from the following specification when read in connection with the accompanying drawing, the single figure of which shows a combined block-schematic circuit diagram of a preferred embodiment of the invention.

With reference now to the drawing, there is shown a system for converting an input voltage on terminal 11 into an output pulse rate on terminal 12. Input resistor 13, chopper stabilized amplifier 14, and feedback resistor 15 may be recognized as components of a conventional operational amplifier wherein the output potential on output line 16 would be $R_2/R_1$, the ratio of feedback resistor 15 ($R_2$) to the input resistor 13($R_1$), times the input potential on input terminal 11 if resistor 15 were connected to output line 16. However, the output potential on line 16 is converted into a signal rate on line 17 by voltage controlled oscillator 21, which may be of the type disclosed in either the copending application of Frink M. Young, entitled Voltage Controlled Oscillator, Serial No. 656,706, filed May 2, 1957, now Patent No. 2,960,668, or that of Bernard M. Gordon, entitled Voltage Controlled Oscillator, Serial No. 677,891, filed August 13, 1957. The remaining apparatus is effective in converting the signal rate on line 17 into a voltage on line 22 which is fed back to the input of chopped stabilized amplifier 14 through feedback resistor 15. Chopper 18 alternately connects the input of chopper amplifier 19 to the first input of amplifier 14 and to ground to provide an A.-C. signal which becomes zero only when the first input of amplifier 14 is precisely at ground potential. The output of chopper amplifier 19 is applied to the other input of amplifier 14 to continuously provide a correctional signal until the first input of amplifier 14 is at ground potential. As a result, parameter variations, such as frequency drift, are automatically compensated for and the rate of the signal on output terminal 12 is a direct linear function of the input potential on terminal 11.

The signal on line 22 reflects both the sense and magnitude of the output signal on line 16. The apparatus between line 17 and output terminal 12 is a digital discriminator of the type disclosed in a paper presented and published at the Pittsburgh meeting of the Association for Computing Machinery, May 2 and 3, 1952, by Bernard M. Gordon and Renato N. Nicola, or disclosed in Patent No. 2,858,425, issued on October 28, 1958, to Bernard M. Gordon.

A reference signal source 23 has a frequency equal to the output frequency of voltage controlled oscillator 21 when the potential on input terminal 11 is zero. Phase shift networks 24 and 25 impart a phase lead of 45° and phase lag of 45°, respectively, to the signal from source 23 so that inputs of mixers 26 and 27 are energized with respective quadrature components of the reference signal.

The other inputs of mixers 26 and 27 are jointly energized by the signal from voltage controlled oscillator 21 on line 17 and provide quadrature components at difference frequency. These components are designated sin $\Delta f$ and cos $\Delta f$ and are provided by mixers 26 and 27, respectively, as indicated. Only the difference frequency signals are passed by low pass filters 31 and 32.

The signal cos $\Delta f$ retains the same polarity, regardless of the sense of $\Delta f$. However, the signal sin $\Delta f$ exhibits an abrupt reversal in polarity when the sense of $\Delta f$ changes. The signal cos $\Delta f$ from low pass filter 32 triggers toggle flip-flop 33 once per half cycle of difference frequency signal. When $\Delta f$ is positive, the signal from the left-hand section of toggle flip-flop 33 and the output sin $\Delta f$ of low pass filter 31 are in phase so that both inputs of gate 34 are conditioned simultaneously once per cycle. Thus, an output pulse is provided once per cycle on line 35 which assures that sign flip-flop 36 is in the set condition to maintain sign terminal 37 at low potential.

Each output pulse on line 35 also triggers blocking oscillator 38 which regenerates each pulse to set core 39. In response to core 39 being set, a positive pulse is provided across output winding 41 and coupled by diode D1 to line 22. The pulses developed across resistor 42 are effectively integrated due to integrating network 40 connected from output line 16 to the first input of amplifier 14 so that a positive potential is fed back through resistor 15 whenever output line 16 is providing an output potential in response to a negative potential on input terminal 11.

When $\Delta f$ is negative, the potential from the right-hand section of toggle flip-flop 33 and the output of low pass filter 31 are in phase. Therefore, gate 34 is not activated while gate 43, deconditioned when $\Delta f$ is positive, provides an output pulse on line 44 once per cycle. This establishes sign flip-flop 36 in the reset condition whereby the potential on terminal 37 is high, indicating that $\Delta f$ is then negative.

Meanwhile, each output pulse on line 44 also triggers blocking oscillator 45. This sets core 46 to provide a negative pulse across winding 47 which is coupled to line 22 by diode D2. The negative pulses thus coupled are effectively integrated to provide a negative potential through feedback resistor 15 to the input of amplifier 14. Thus, when line 16 is providing a potential in response to a positive input potential on terminal 11, a negative potential is fed back to the input of amplifier 14. The output of the right-hand section of toggle flip-flop 33 is differentiated by differentiator 51 to provide pulses which occur at a rate equal to the difference frequency $\Delta f$. The positive potential on terminal 48 is coupled by resistor 49 to reset windings 54 and 55 of cores 46 and 39, respectively, to reset that core previously set by a pulse from one of blocking oscillators 45 or 38. The cores are switched between opposite saturated states and blocking oscillators 45 and 38 generate pulses of equal duration so that the output pulses derived across windings 41 and 47 are of equal volt-second area. As a result, the integrated fed back voltage is linearly and directly related to the output signal rate. Moreover, the area of the pulses is dependent only upon the physical characteristics of the core windings and the blocking oscillator output pulse duration. These parameters are relatively insensitive to supply voltage variations over a significant range.

It is seen that an operational amplifier has been provided wherein a feedback loop coupling the output to the input includes means for converting the amplitude of the amplifier output on line 16 to a related rate and reconverting this rate to a related amplitude on line 22 utilized to servo the operational amplifier whereby it functions essentially as if line 22 were directly connected to line 16. However, the output potential on line 16 is continuously altered until the potential on line 22 is exactly $-R_2/R_1$ (where $R_2$ is the feedback resistance and $R_1$ is the input resistance of the operational amplifier) times the input potential on terminal 11. In addition, the polarity of the input signal is indicated on terminal 37. As a result, the relation between output frequency and input voltage of voltage control oscillator 21 need not be linear and the only parameters which must be critically maintained are the values of resistors 13 and 15. In addition, the output pulses derived across windings 41 and 47 are preferably of equal energy content. The latter requirement is readily met as indicated above. Thus, a direct and exceptionally linear relation is established between an input signal amplitude and an output signal rate while minimizing the number of parameters which must be precisely maintained. Moreover, it is relatively easy to maintain the critical parameters within relatively close tolerances. The output pulse rate may be applied to a conventional binary counter during prescribed time intervals to obtain a parallel binary code characteristic of the input signal amplitude.

Various types of signal amplitude to rate and rate to signal amplitude converters may be employed to accomplish the novel results of this invention, the specific system described herein being by way of example only. Numerous other modifications of and departures from this specific embodiment may be practiced by those skilled in the art without departing from the inventive concepts. Consequently, the invention is to be construed as limited only by the spirit and scope of the amended claims.

What is claimed is:

1. In a system having a chopper stabilized operational amplifier for converting an input signal amplitude into a directly proportional rate, apparatus in the feedback loop of said operational amplifier comprising, an oscillator providing an output signal having a frequency controlled in accordance with the amplitude of the output signal from said operational amplifier, a source of a signal of reference frequency, means for mixing said oscillator output signal with time quadrature components of said reference frequency signal to derive first and second signals in time quadrature at difference frequency, first and second gating means jointly energized by said first signal, means responsive to said second signal for conditioning said first and second gating means during mutually exclusive time intervals in accordance with the relative phase between said first and second signals, means responsive to the output signal of the conditioned gating means for providing a sign output signal characteristic of the polarity of said input signal, means responsive to said first and second gating means output signals for providing first and second oppositely polarized feedback signals having a magnitude indicative of said difference frequency, and means for coupling said first and second feedback signals to the input of said chopper stabilized operational amplifier.

2. Apparatus in accordance with claim 1 wherein said means providing said first and second feedback signals comprises, first and second magnetic cores each having first and second stable states, means responsive to said first and second gating means output signals for respectively setting said first and second cores to the second stable state for a prescribed duration, the core associated with the conditioned gating means being set for said prescribed duration once per cycle at difference frequency, first and second oppositely poled unilaterally conducting devices respectively coupling first and second pulse trains of opposite polarity from said first and second cores when repetitively set, and means for integrating said first and second pulse trains to derive said first and second feedback signals.

3. Converting apparatus for furnishing an output signal having a frequency proportional to the magnitude of an input signal comprising, an operational amplifier having an output coupled to its input by a feedback loop, said feedback loop including an oscillator having its frequency controlled by the voltage at the output of said amplifier, a digital discriminator connected to said oscillator, said discriminator being of the type having a polarity signal indicative of the sense of frequency deviation of the oscillator's output from a reference frequency and a pulse rate signal indicative of the magnitude of the frequency deviation, first and second energy sources for supplying signals of opposite polarity, each of said sources supplying a pulse of constant energy content in response to each pulse applied to its input, and gating means controlled by the polarity signal of said discriminator for directing the pulse rate signal of said discriminator to the input of one or the other of said energy sources.

References Cited in the file of this patent

UNITED STATES PATENTS

| | | |
|---|---|---|
| 2,497,129 | Liston | Feb. 14, 1950 |
| 2,684,999 | Goldberg et al. | July 27, 1954 |
| 2,832,848 | Neff | Apr. 29, 1958 |
| 2,858,425 | Gordon | Oct. 28, 1958 |
| 2,900,607 | Barabutes et al. | Aug. 18, 1959 |
| 2,903,523 | Toomim et al. | Sept. 8, 1959 |